United States Patent
Kawakita

(10) Patent No.: US 7,884,418 B2
(45) Date of Patent: Feb. 8, 2011

(54) SEMICONDUCTOR DEVICE AND TRANSISTOR

(75) Inventor: Keizo Kawakita, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 88 days.

(21) Appl. No.: 12/145,129

(22) Filed: Jun. 24, 2008

(65) Prior Publication Data
US 2009/0001454 A1 Jan. 1, 2009

(30) Foreign Application Priority Data
Jun. 26, 2007 (JP) .............................. 2007-167377

(51) Int. Cl.
*H01L 29/66* (2006.01)
(52) U.S. Cl. ................. 257/327; 257/328; 257/330; 257/E29.001; 257/E27.091; 257/E27.095; 257/E27.201
(58) Field of Classification Search .......... 257/327, 257/E29.001, 328, 330, E27.091, E27.095, 257/E29.201
See application file for complete search history.

(56) References Cited

U.S. PATENT DOCUMENTS
6,444,528 B1* 9/2002 Murphy .................. 438/270
7,553,748 B2* 6/2009 Jang et al. ............... 438/586

FOREIGN PATENT DOCUMENTS
JP 05-343681 A 12/1993
JP 11-068069 A 3/1999
JP 2002-151688 A 5/2002

* cited by examiner

*Primary Examiner*—Bradley K Smith
*Assistant Examiner*—Mohammad T Karimy
(74) *Attorney, Agent, or Firm*—Sughrue Mion, PLLC

(57) ABSTRACT

A semiconductor device includes active areas which are insulatedly separated from each other by element-separation insulating films; a gate insulating film formed on each active area; a gate electrode which extends across the active area via the gate insulating film; a source area and a drain area formed in the active area so as to interpose the gate electrode; and a fin-channel structure in which at the intersection between the active area and the gate electrode, trenches are provided at both sides of the active area, and part of the gate electrode is embedded in each trench via the gate insulating film, so that the gate electrode extends across a fin which rises between the trenches. In the gate insulating film, the film thickness of a part which contacts the bottom surface of each trench is larger than that of a part which contacts the upper surface of the fin.

8 Claims, 22 Drawing Sheets

SEMICONDUCTOR DEVICE AND TRANSISTOR

BACKGROUND OF THE INVENTION

1. Field of the Invention

The present invention relates to a semiconductor device having a fin-channel structure, and a relevant transistor.

Priority is claimed on Japanese Patent Application No. 2007-167377, filed Jun. 26, 2007, the contents of which are incorporated herein by reference.

2. Description of the Related Art

In accordance with recent progress in fine processing of semiconductor devices, the size of each transistor tends to decrease, which makes a short channel effect of the transistor more remarkable. For example, in a DRAM (dynamic random access memory) or the like, as the channel length of the transistor is also reduced due to a reduction in the memory-cell size, the performance of the transistor is degraded, thereby degrading the data retention and writing performance of the memory cell.

In order to solve such a problem, a recess transistor, a fin-FET (fin-field effect transistor), and the like have been developed (see Patent Documents 1 to 3). The recess transistor has a three-dimensional channel structure in which a trench is formed in a semiconductor substrate. The fin-FET has a three-dimensional channel structure in which a fin (part) made of silicon (i.e., a silicon fin) is formed on a semiconductor substrate.

More specifically, the three-dimensional channel structure of the recess transistor is produced by forming a trench in a semiconductor substrate, and forming a gate electrode in the trench via a gate insulating film, and the three-dimensional channel structure of the fin-FET is produced by forming a silicon fin on a semiconductor substrate, and then forming a gate electrode which extends across the fin. In either case, the gate length can be increased, thereby reducing or suppressing the short channel effect.

Patent Document 1: Japanese Unexamined Patent Application, First Publication No. H5-343681.
Patent Document 2: Japanese Unexamined Patent Application, First Publication No. H11-68069.
Patent Document 3: Japanese Unexamined Patent Application, First Publication No. 2002-151688.

In a structure in which the fin of a fin-FET is connected to a substrate, a sub channel is formed on the lower side of the fin. In order to increase the threshold voltage (Vth) of the sub channel, ion implantation must be performed so as to increase the impurity concentration of the substrate. However, in this case, the number of processes to be performed increases.

Also in a structure in which such a fin is connected to a substrate, as there is a capacitance between the substrate and the lower side of the fin which does not contribute to the number of ions, the gate capacitance increases. In order to solve this problem, the relevant capacitance may be reduced by thickening an oxide film provided between the substrate and the lower side of the fin, so as to reduce the relevant capacitance. However, the relevant processes are complex, which increases the manufacturing cost.

SUMMARY OF THE INVENTION

In light of the above circumstances, an object of the present invention is to provide a semiconductor device having a fin-channel structure, and a relevant transistor, by which it is unnecessary to perform ion implantation so as to increase the impurity concentration of the relevant substrate and to increase Vth of the sub channel; the gate capacitance does not increase; and the device speed can be further increased without increasing the manufacturing cost.

Therefore, the present invention provides a semiconductor device including:

active areas which are insulatedly separated from each other by element-separation insulating films embedded in a substrate;

a gate insulating film formed on each active area;

a gate electrode formed in a manner such that it extends across the active area via the gate insulating film;

a source area and a drain area formed in the active area in a manner such that they interpose the gate electrode; and a fin-channel structure in which at the intersection between the active area and the gate electrode, trenches are provided at both sides of the active area, and part of the gate electrode is embedded in each of the trenches via the gate insulating film, so that the gate electrode extends across a fin which rises between the trenches, wherein:

in the gate insulating film, the film thickness of a part which contacts the bottom surface of each trench is larger than that of a part which contacts the upper surface of the fin.

In accordance with the above structure, the threshold voltage (Vth) of a sub channel (formed on the lower side of the fin) can be increased, and a leakage current between the drain area and the source area due to the sub channel can be reduced or prevented. It is also possible to reduce the capacitance between the gate electrode and the substrate, so that an ever higher speed of a high-speed device can be targeted.

In a typical example, each of the trenches has a form whose width gradually decreases toward the bottom surface of the trench, so that each side face of the fin is inclined toward the bottom surface of the corresponding trench.

In this case, preferably, the width of the bottom surface of each trench is smaller than twice the film thickness of the part of the gate insulating film, which contacts the upper surface of the fin.

Also preferably, the angle between the bottom surface of the trench and the corresponding side face of the fin is greater than or equal to 85°, and smaller than 90°.

The present invention also provides a transistor having a fin-channel structure, comprising:

a substrate having a protruding part; and a gate insulating film which covers the upper surface and side faces of the protruding part along a first direction, wherein:

in the gate insulating film which covers each of the side faces, the film thickness of a part on the lower side of the side face is larger than that of a part on the upper side of the side face.

In a typical example, first and second diffusion-layer areas are provided in a manner such that they interpose the protruding part in a second direction perpendicular to the first direction.

The present invention also provides a semiconductor device comprising the transistor as described above.

The present invention also provides a transistor comprising:

source and drain areas;

a first region sandwiched between the source and drain areas, the first region producing a first current path between the source and drain areas in response to a first voltage that is larger in absolute value than a first threshold voltage; and a second region sandwiched between the source and drain areas in parallel to the first region, the second region producing a second current path between the source and drain areas in response to a second voltage that is larger in absolute value than a second threshold voltage, the second voltage being larger in absolute value than the first voltage.

Typically, the transistor further comprises:

a trench provided between the source and drain areas in parallel to the first and second regions, the first region having a side surface defining a first part of the trench and the second region having a side surface defining a second part of the trench; and an insulating film having a first portion covering the first part of the trench and a second portion covering the second part of the trench, the first portion being smaller in thickness than the second portion.

The transistor may further comprise gate electrode filling the trench in contact with the first and second portions of the insulating film.

Preferably, the gate electrode is in contact at a bottom portion thereof with the second portion of the insulating film.

DETAILED DESCRIPTION OF THE INVENTION

Hereinafter, a semiconductor device and a relevant transistor, to which the present invention is applied, will be described in detail with reference to the appended figures. In order to show distinctive features in an easily-understandable manner, parts corresponding to the distinctive features may be enlarged in the figures, that is, the dimensional ratio between the shown structure elements may not correspond to the actual ratio therebetween. In addition, materials, sizes, and the like, which are employed in the following embodiment, are just examples, and the present invention is not limited thereto.

Figure 1:
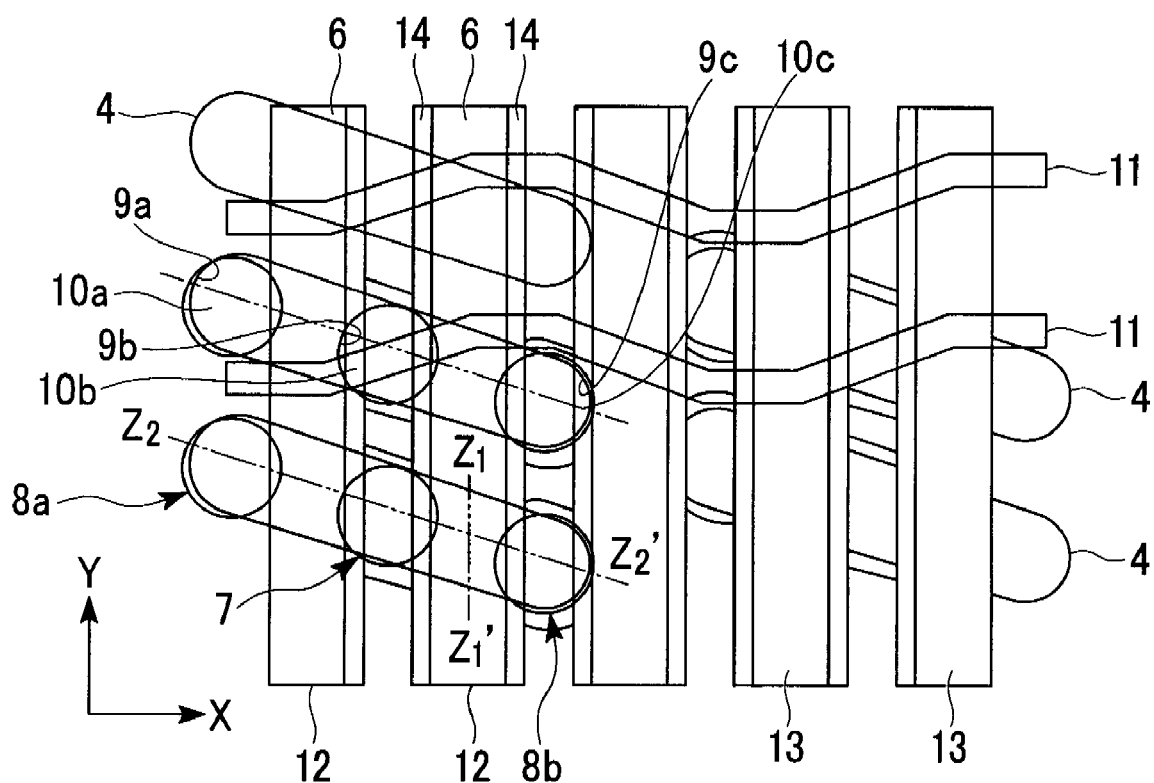
FIG. 1 is a plan view showing an embodiment of the semiconductor device of the present invention.
Figure 2:
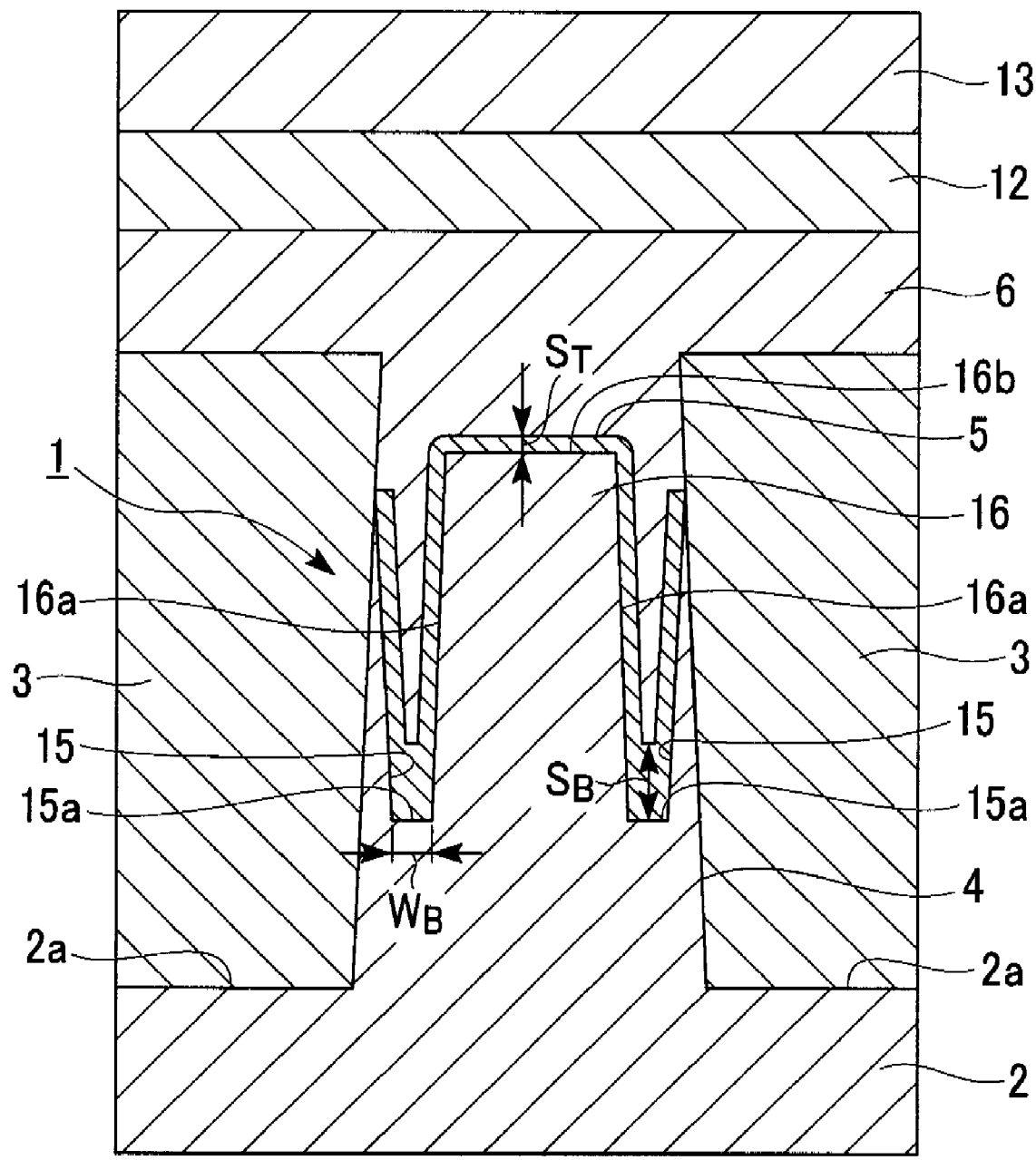
FIG. 2 is a sectional view along line $Z_1$-$Z_1$' in FIG. 1.
Figure 3:
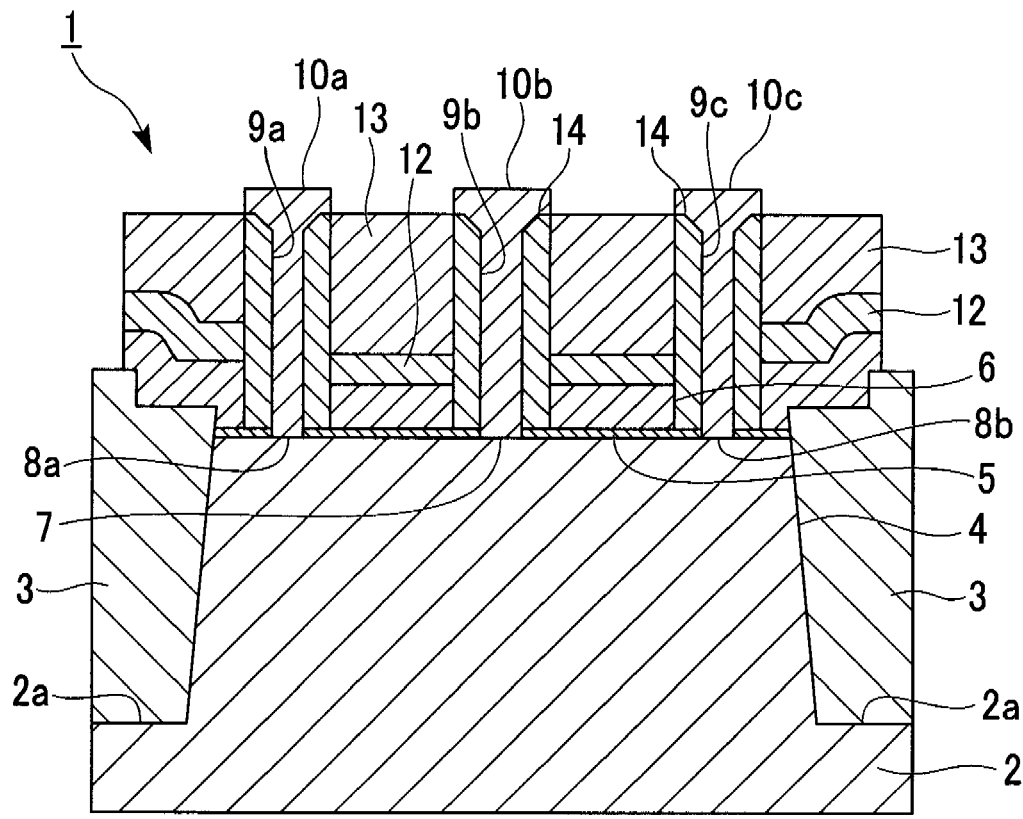
FIG. 3 is a sectional view along line $Z_2$-$Z_2$' in FIG. 1.

In the embodiment of the semiconductor device, the present invention is applied to a fin-FET 1 as shown in FIGS. 1 to 3.

The fin-FET 1 to which the present invention is applied may be used as a transistor for selecting one of memory cells arranged in a cell array area of a DRAM (dynamic random access memory) as shown in FIG. 1, where in the cell array area, a 2-bit memory cell is provided in each active area.

More specifically, as shown in FIGS. 1 to 3, in the cell array area, element-separation insulating films 3 are formed as STI (shallow trench isolation) films in a surface area (or layer) of a semiconductor substrate 2, thereby forming a plurality of active areas 4.

The semiconductor substrate 2 includes impurities having a specific impurity concentration, and may be a silicon substrate. In addition, the semiconductor substrate 2 needs to have at least a silicon surface area (or layer). Such a substrate is not limited to a silicon substrate, and may be an SOI (silicon on insulator) substrate in which a silicon thin layer is formed on a buried oxide film (i.e., BOX film). When using such an SOI substrate, the contact capacitance between each source and the corresponding drain can be reduced, and a further fine structure can be targeted.

Each element-separation insulating film 3 may be made of a silicon oxide film, and is buried in a trench 2a formed in a surface layer of the semiconductor substrate 2, so as to isolate each active area 4 in an insulating manner. That is, each active area 4, as a part of the semiconductor substrate 2, is insulatedly separated by means of the element-separation insulating films 3, and has a substantially rectangular shape in plan view. In the cell array area in FIG. 1, the active areas 4 are arranged at regular intervals in both the X (horizontal) and Y (vertical) directions.

In the cell array area, gate electrodes 6 extend over each active area 4 via a gate insulating film 5 which is formed on the active area 4 (see FIGS. 1 and 2). The gate insulating film 5 may be a silicon oxide film formed by oxidizing the surface of the active area 4 by means of thermal oxidation. The gate electrode 6 may be a polysilicon film.

A drain area 7 and source areas 8a and 8b are formed in the active area 4, in a manner such that the source area 8a and the drain area 7, and the drain area 7 and the source area 8b, each interpose the gate electrode 6. More specifically, impurity-diffusion layers are formed by ion implantation at the center and both sides of each active area 4, so as to interpose each of the gate electrodes 6. Among the impurity-diffusion layers, the center layer functions as the drain area 7, and the side layers function as the source areas 8a and 8b. Immediately on the source area 8a, drain area 7, and source area 8b, contact holes 9a, 9b, and 9c are respectively provided, and pass through an inter-layer insulating film (not shown) which covers the surfaces of the drain area 7 and the source areas 8a and 8b. The source area 8a, drain area 7, and source area 8b are respectively and electrically connected to contact plugs 10a, 10b, and 10c which are respectively embedded in the contact holes 9a, 9b, and 9c. The contact plugs 10a and 10c on the source areas 8a and 8b of each active area 4 are each electrically connected to a capacitor (not shown) which forms the relevant memory cell together with the fin-FET 1.

In the cell array area, bit wiring lines 11, each of which has a wavy form and extends in the X (horizontal) direction in FIG. 1, are arranged at regular intervals along the Y (vertical) direction. Each of the bit wiring lines 11 subsequently passes through each center of the active areas 4 which are arranged in the X direction, so that it is electrically connected to the contact plug 10b on the drain area 7 of each active area 4.

Also in the cell array area, word wiring lines 12, each of which has a straight form and extends in the Y direction in FIG. 1, are arranged at regular intervals along the X direction. Each of the word wiring lines 12 subsequently passes between the drain area 7 and the source area 8a or 8b in each of the active areas 4 arranged in the Y direction, so that it is electrically connected to the above-described gate electrode (see FIG. 2) at the intersection between the word wiring line 12 and the relevant active area 4.

As shown in FIG. 3, each word line 12 is stacked on the corresponding gate electrode 6, and an insulating-film hard mask 13 is further stacked on the word line 12. On each side of the stacked gate electrode 6, word line 12, and insulating-film hard mask 13, a side wall 14 made of an insulating film (e.g., silicon nitride film) is provided.

In the above-described cell array area of the semiconductor substrate 12, the fin-FET 1 is formed by each active area 4 which is insulatedly separated by the element-separation insulating films 3 buried in the semiconductor substrate 2; the gate insulating film 5 formed on the active area 4, the gate electrode 6 which extends across the active area 4 via the gate insulating film 5; and the source area 7 and the source area 8a or 8b (which correspond to the first and second diffusion-layer areas of the present invention), which are formed at the center and a side of the active area 4, and interpose the gate electrode 6 therebetween.

As shown in FIG. 2, the fin-FET 1 has a fin-channel structure in which trenches 15 are provided on both sides of the active area 4, and part of the gate electrode 6 is embedded in each trench 15 via the gate insulating film 5, so that a fin (part) 16 rises between the trenches 15, and the gate electrode 16 extends across the fin 16.

At the intersection between the active area 4 and the gate electrode 6, the trenches 15 are formed by excavating the active area 4 in the length direction thereof. The width of each trench 15 gradually decreases toward the bottom surface 15a thereof, so that both side faces of the fin 16 are inclined toward the bottom surface 15a. That is, in accordance with the trenches 15 on both sides of the fin 16, the upper side of the fin 16 has a smaller width than the width of the lower side thereof.

In the fin-FET 1 having the above structure, the gate length can be increased, thereby reducing or suppressing the short channel effect.

In addition, the fin-FET 1, to which the present invention is applied, has a distinctive feature in which in the gate insulating film 5, the thickness of the part which contacts the bottom surface 15a of each trench 15 is larger than that of the part which contacts the upper surface 16b of the fin 16. That is, as shown in FIG. 2, the gate insulating film 5 satisfies the relationship "$S_T < S_B$", where $S_B$ indicates the film thickness of the part which contacts the bottom surface 15a of each trench 15, and $S_t$ indicates the film thickness of the part which contacts the upper surface 16b of the fin 16.

In the fin-FET 1 having the above structure, the threshold voltage Vth of a sub channel formed on the lower side of the fin 16 can be increased, and it is possible to reduce or prevent a leakage current between the drain area 7 and the source area 8a or 8b, which is caused by the sub channel. It is also possible to reduce the capacitance between the gate electrode 6 and the semiconductor substrate 2, so that an ever higher speed of a high-speed device can be targeted.

In order to satisfy the above relationship "$S_T < S_B$" for the fin-FET 1, it is preferable that the width of the bottom surface 15a of each trench 15 is smaller than twice the film thickness $S_T$ of the part (of the gate insulating film 5) which contacts the upper surface 16b of the fin 16. That is, in the present fin-FET 1, it is preferable to satisfy the relationship "$2S_T > W_B$", where $W_B$ indicates the width of the bottom surface 15a of the trench 15.

Also in order to satisfy the above relationship "$S_T < S_B$", it is preferable that the angle between the bottom surface 15a of the trench 15 and the corresponding side face 16a of the fin 16 is greater than or equal to 85°, and smaller than 90°. That is, in the present fin-FET 1, it is preferable to satisfy the relationship "$85° \leq \theta < 90°$", where θ indicates the angle between the bottom surface 15a of the trench 15 and the corresponding side face 16a of the fin 16.

Accordingly, in the gate insulating film 5 of the fin-FET 1, the thickness $S_B$ of the part which contacts the bottom surface 15a of each trench 15 can be larger than the thickness $S_T$ of the part which contacts the upper surface 16b of the fin 16.

Below, as a method of manufacturing the semiconductor device to which the present invention is applied, the method for manufacturing the above fin-FET 1 will be explained.

Figure 4:
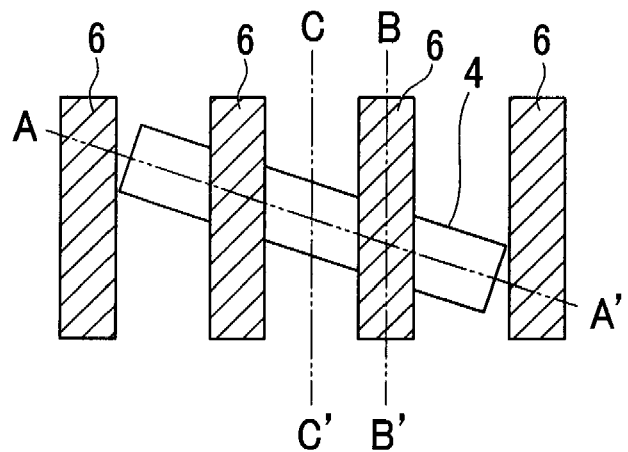
FIG. 4 is a plan view showing sectional lines with respect to the following sectional views.

In FIGS. 5A to 24C for showing the manufacturing processes of the fin-FET 1, each figure which has a figure number including "A" is a sectional view along line A-A in FIG. 4 (schematic diagram for showing the relevant sectional lines), each figure which has a figure number including "B" is a sectional view along line B-B in FIG. 4, and each figure which has a figure number including "C" is a sectional view along line C-C in FIG. 4.

Figure 5A:
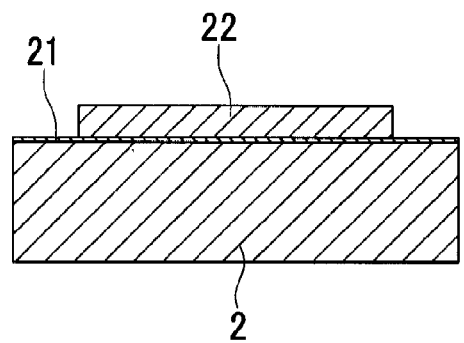
FIGS. 5A to 5C are sectional views showing one of a series of processes for manufacturing the semiconductor device in FIG. 1.
Figure 5B:
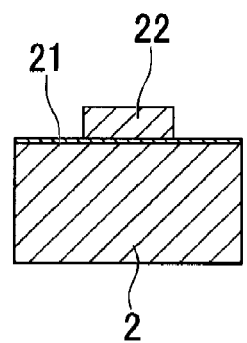
Figure 5C:
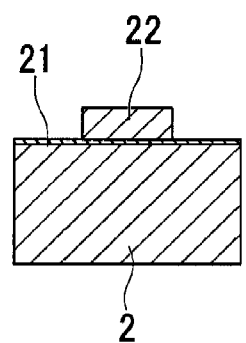

When manufacturing the fin-FET 1, first, as shown in FIGS. 5A to 5C, the surface of the semiconductor substrate (before processing) is oxidized by means of thermal oxidation, so as to form a silicon oxide film 21, and then a silicon nitride film 22 is formed thereon by means of LP-CVD (low-pressure chemical vapor deposition). After the silicon nitride film 22 is coated with a resist (film), the resist is patterned by means of lithography, so as to form a resist pattern (not shown) corresponding to the active areas 4. The silicon nitride film 22 is subjected to patterning by means of dry etching which uses the resist pattern as a mask, and the resist pattern is then removed. Accordingly, on the semiconductor substrate 2, the silicon nitride film 22, which has been patterned so as to have a form corresponding to the active areas 4, and the silicon oxide film 21 remain. In a concrete example which was actually performed, the silicon oxide film 21 had a thickness of approximately 13 nm, and the silicon nitride film 22 had a thickness of approximately 140 nm.

Figure 6A:
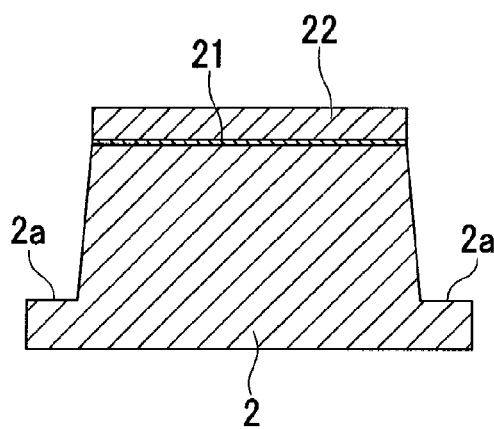
FIGS. 6A to 6C are also sectional views showing one of the manufacturing processes.
Figure 6B:
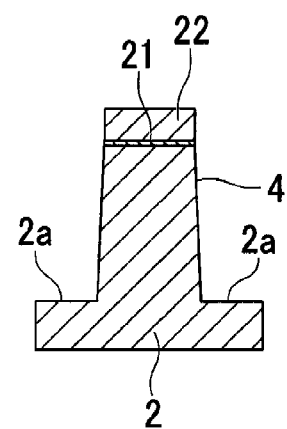
Figure 6C:
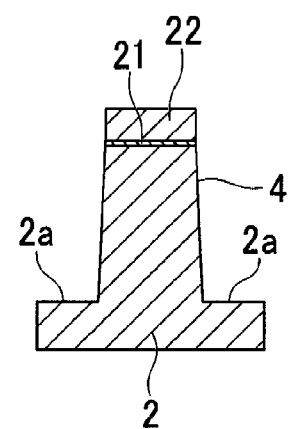

Next, as shown in FIGS. 6A to 6C, the silicon oxide film 21 and a surface layer of the semiconductor substrate 2 are patterned by means of dry etching by using the patterned silicon nitride film 22 as a mask. Accordingly, trenches 2a are formed in the surface layer of the semiconductor substrate 2. In the concrete example, the trenches 2a had a depth of approximately 200 nm.

Figure 7A:
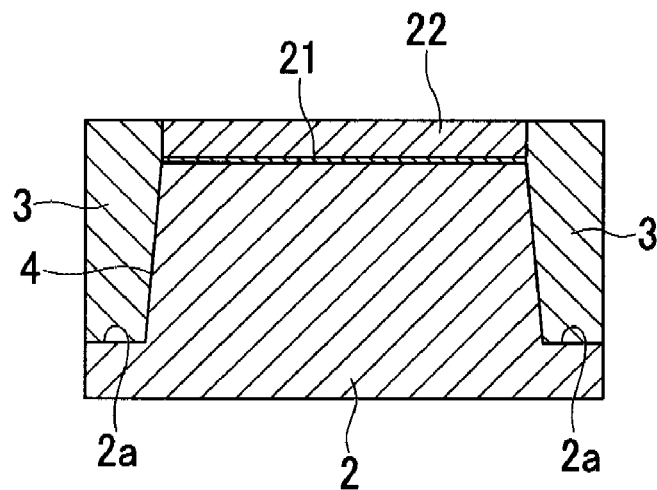
FIGS. 7A to 7C are also sectional views showing one of the manufacturing processes.
Figure 7B:
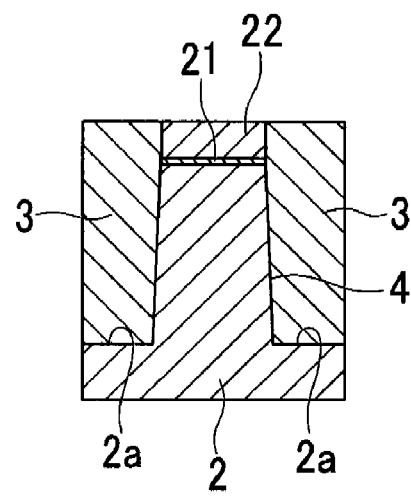
Figure 7C:
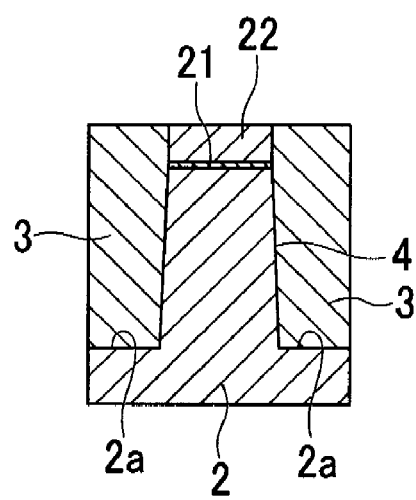

Next, as shown in FIGS. 7A to 7C, a silicon oxide film is formed on the entire surface of the semiconductor substrate 2 by means of HDP-CVD (high-density plasma chemical vapor deposition), and the surface of the silicon oxide film is then polished by CMP (chemical mechanical polishing) by using the silicon nitride film 22 as a stopper, so as to perform planarization until the surface of the silicon nitride film 22 is exposed. Accordingly, the silicon oxide film (as the above-described element-separation insulating film 3) is embedded in each trench 2a. In the concrete example, the formed silicon oxide film had a thickness of approximately 350 nm.

Figure 8A:
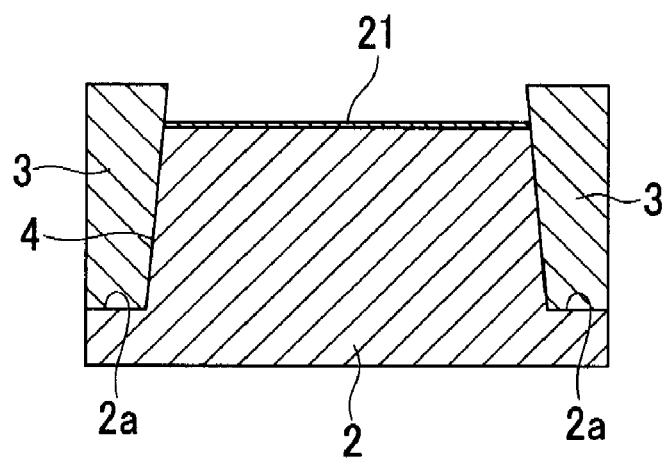
FIGS. 8A to 8C are also sectional views showing one of the manufacturing processes.
Figure 8B:
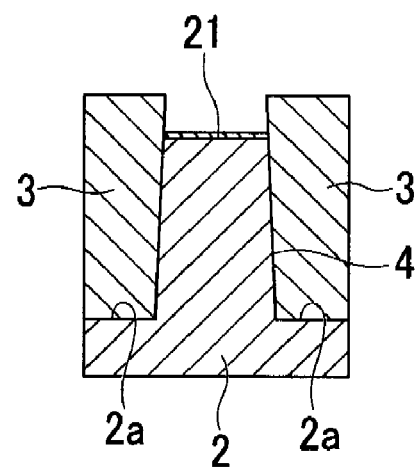
Figure 8C:
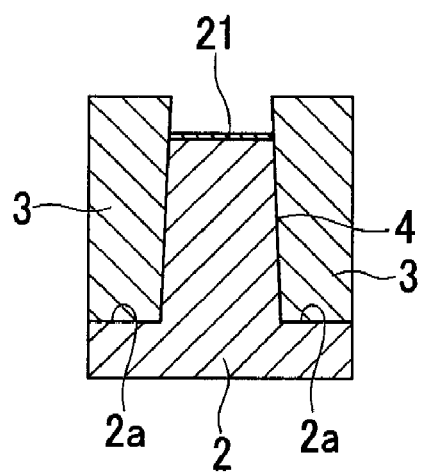

Next, as shown in FIGS. 8A to 8C, the silicon nitride film 22 is removed by using a hot phosphoric acid. Accordingly, in the cell array area of the semiconductor substrate 2, a plurality of active areas 4 are formed, each being insulatedly separated by the element-separation insulating films 3.

Figure 9A:
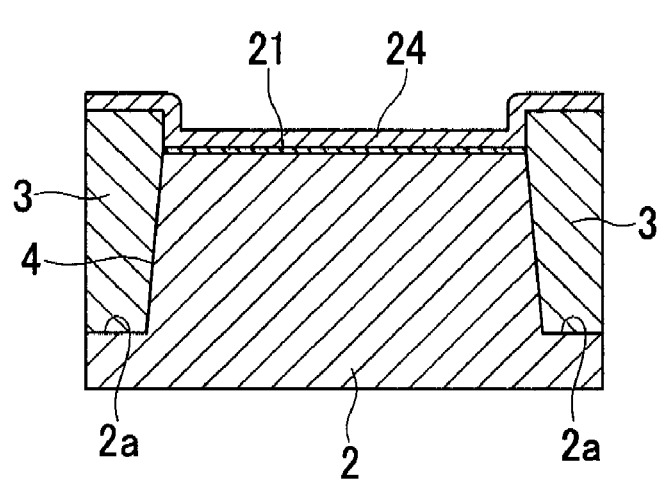
FIGS. 9A to 9C are also sectional views showing one of the manufacturing processes.
Figure 9B:
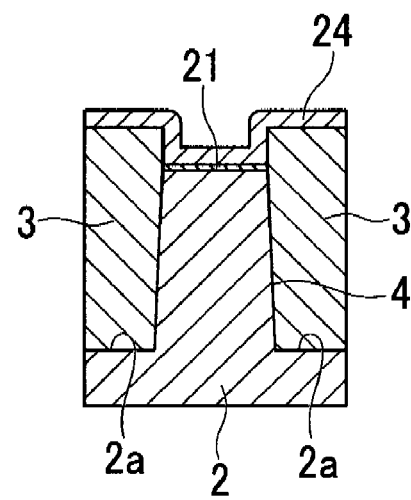
Figure 9C:
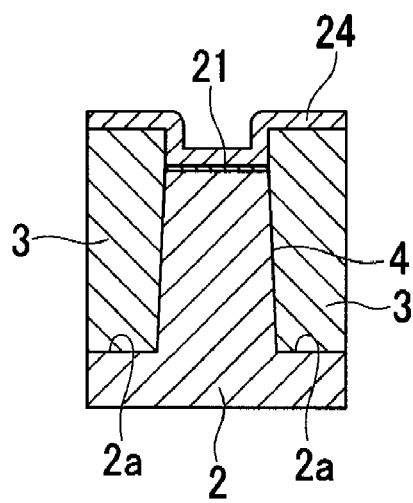

Next, as shown in FIGS. 9A to 9C, a silicon nitride film 24, which is thinner than the above-described silicon nitride film 22, is formed on the entire surface of the semiconductor substrate 2. Accordingly, a part of the silicon nitride film 24 is embedded in the recessed part of each active area 4, where the recessed part is lower than the above-described silicon oxide films (as the element-separation insulating films 3) on both sides thereof. In the concrete example, the silicon nitride film 24 had a thickness of approximately 15 to 25 nm.

Figure 10A:
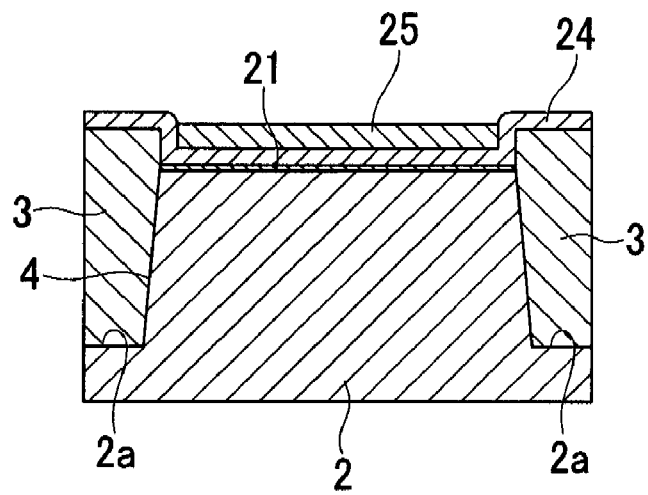
FIGS. 10A to 10C are also sectional views showing one of the manufacturing processes.
Figure 10B:
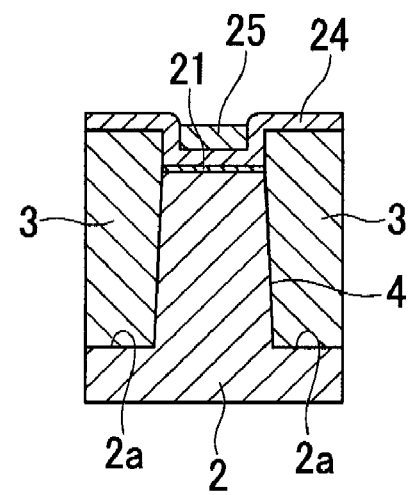
Figure 10C:
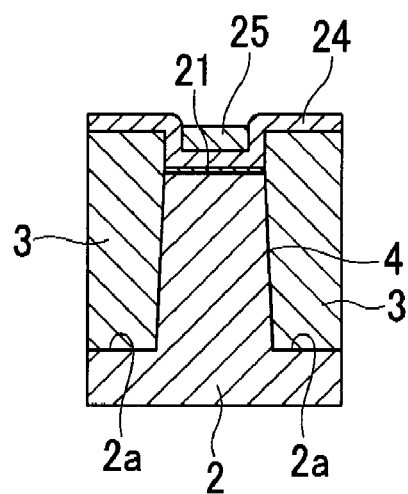

Next, as shown in FIGS. 10A to 10C, a silicon oxide film 25 is formed on the entire surface of the silicon nitride film 24, and the surface of the silicon oxide film 25 is then polished by CMP by using the silicon nitride film 24 as a stopper, so as to perform planarization until the surface of the silicon nitride film 24 is exposed. Accordingly, the silicon oxide film 25 is embedded in the above-described recessed part of the active area 4.

Figure 11A:
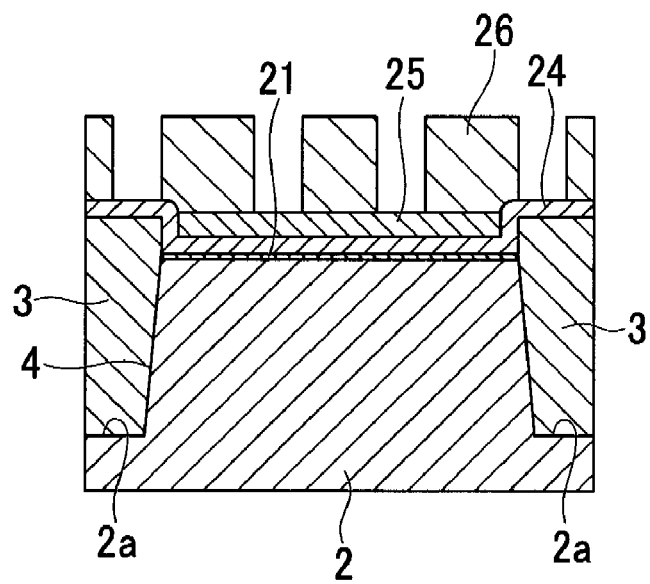
FIGS. 11A to 11C are also sectional views showing one of the manufacturing processes.
Figure 11B:
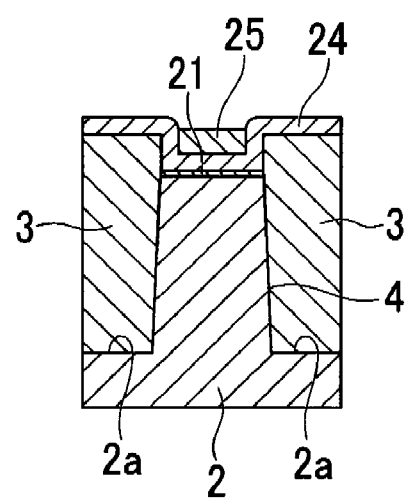
Figure 11C:
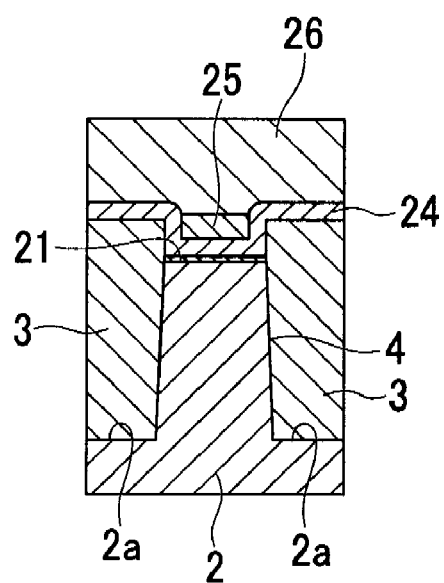

Next, as shown in FIGS. 11A to 11C, a resist is deposited on the semiconductor substrate 2, and is then patterned by means of lithography, so as to form a resist pattern 26 having openings whose positions correspond to the gate electrode 6, the drain area 7, and the source areas 8a and 8b on the active area 4.

Figure 12A:
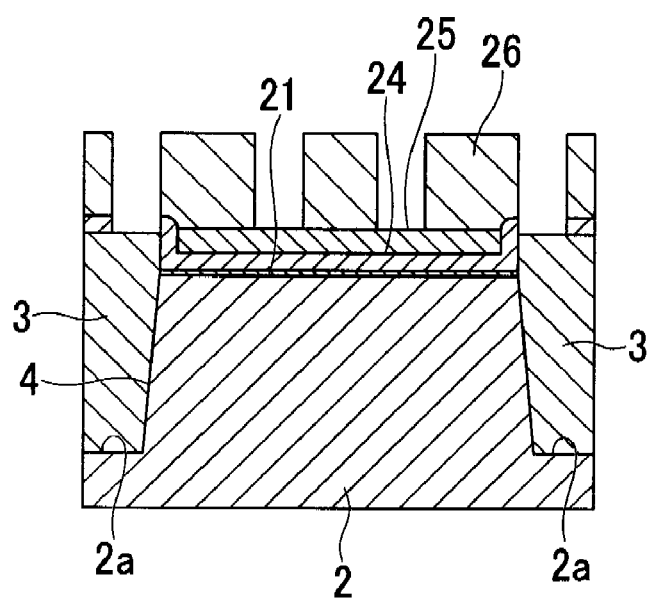
FIGS. 12A to 12C are also sectional views showing one of the manufacturing processes.
Figure 12B:
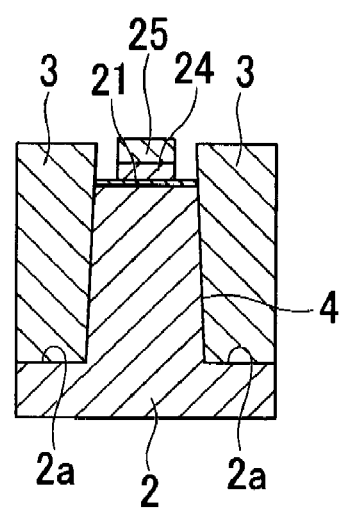
Figure 12C:
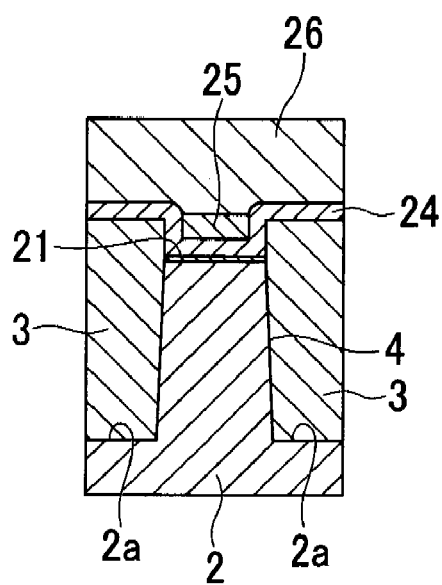

Next, as shown in FIGS. 12A to 12C, the silicon nitride film 24 is subjected to patterning by means of dry etching which uses the resist pattern 26 as a mask, and then the resist pattern 26 is removed. The silicon oxide film 25 is then back-etched, and after that, the surface layer of the semiconductor substrate 2 is subjected to patterning by means of anisotropic dry etching which uses the silicon nitride film 24 and the silicon oxide film 25 as a mask.

Figure 13A:
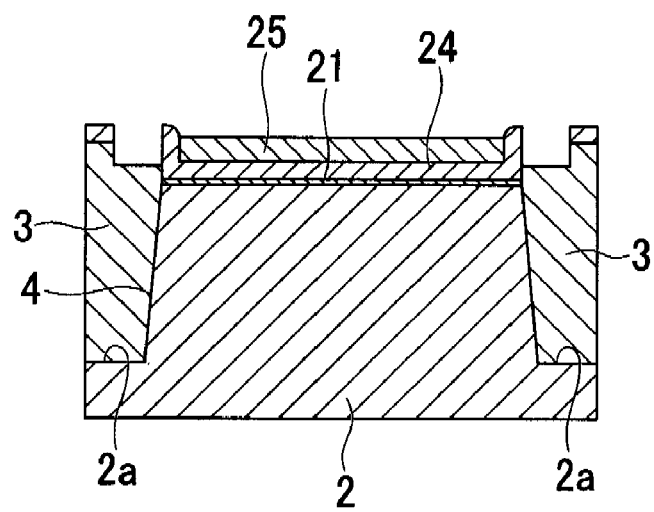
FIGS. 13A to 13C are also sectional views showing one of the manufacturing processes.
Figure 13B:
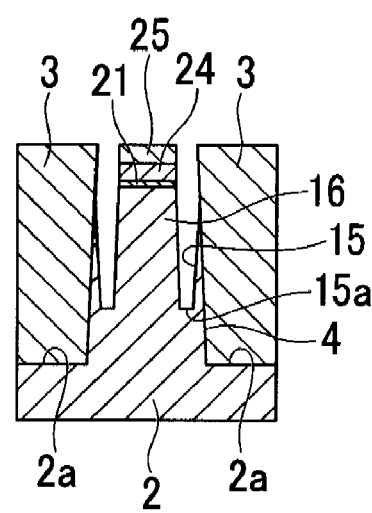
Figure 13C:
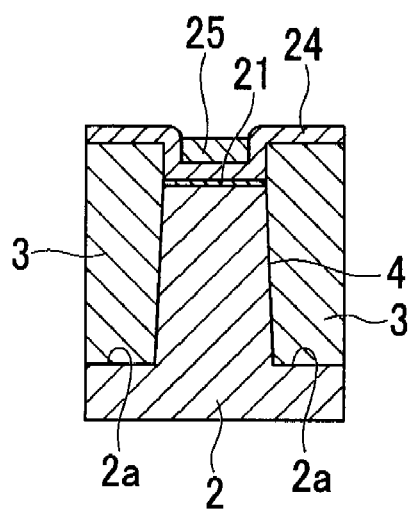

Accordingly, as shown in FIGS. 13A to 13C, in each active area 4, a pair of trenches 15, whose width gradually decreases toward the bottom surface 15a, and a fin 16 interposed by the trenches 15 are formed, where the upper side of the fin 16 is narrower than the lower side thereof. In the concrete example, after the resist pattern 26 was removed, the silicon oxide film 25 was back-etched by 13 nm, and a part (having a thickness of approximately 100 to 150 nm) of the surface layer of the semiconductor substrate 2 was removed by anisotropic dry etching. In addition, during the anisotropic dry etching, the temperature of the substrate was controlled within 5 to 30° C., so that the angle between the bottom surface 15a of the trench 15 and the corresponding side face 16a of the fin 16 was set to be greater than or equal to 85°, and smaller than 90°.

Figure 14A:
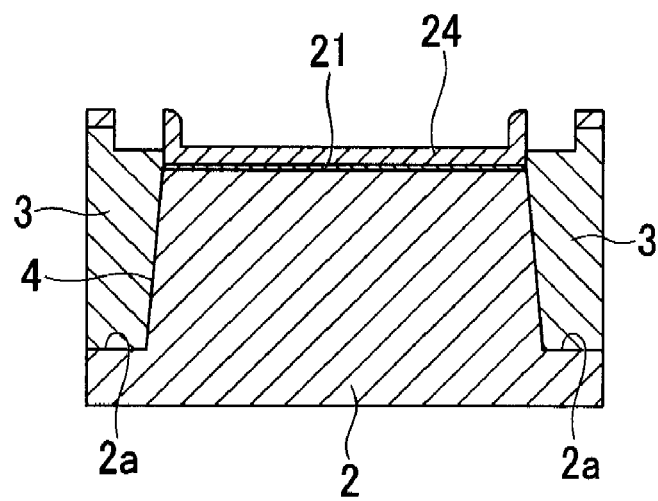
FIGS. 14A to 14C are also sectional views showing one of the manufacturing processes.
Figure 14B:
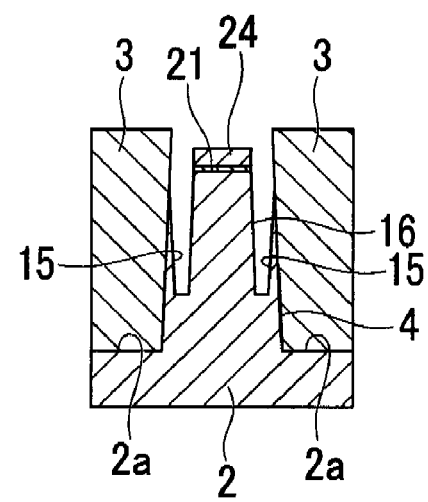
Figure 14C:
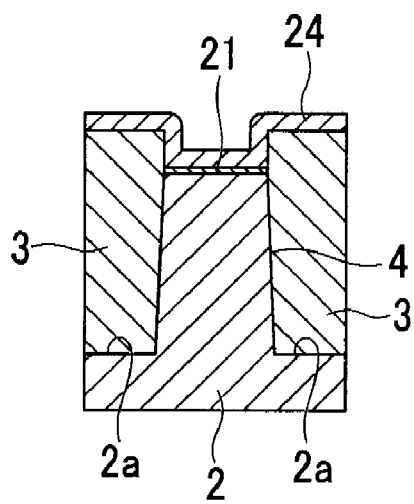
Figure 15A:
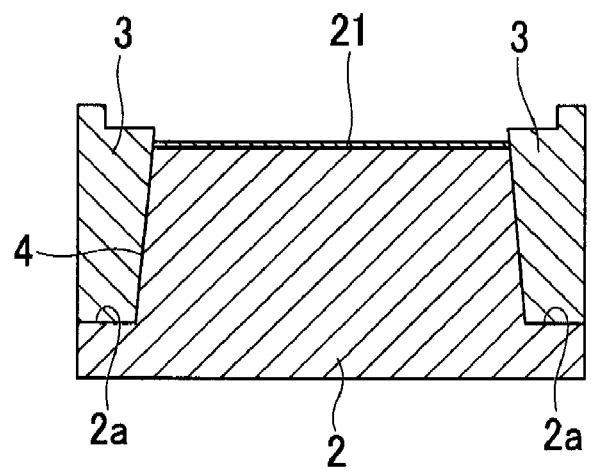
FIGS. 15A to 15C are also sectional views showing one of the manufacturing processes.
Figure 15B:
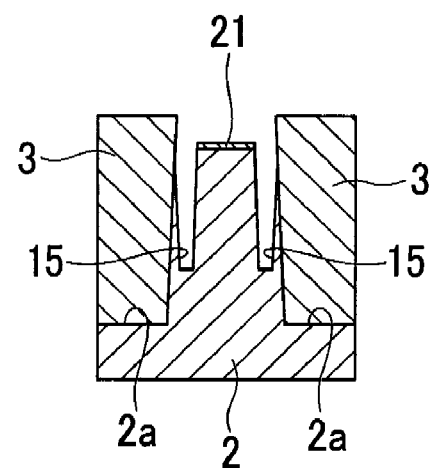
Figure 15C:
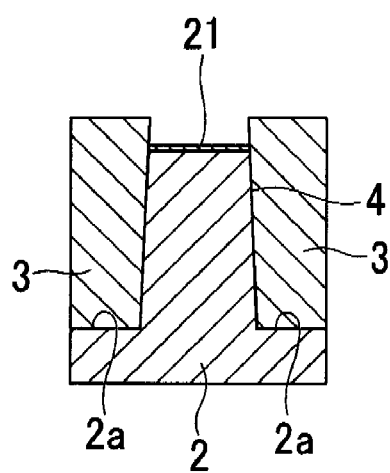
Figure 16A:
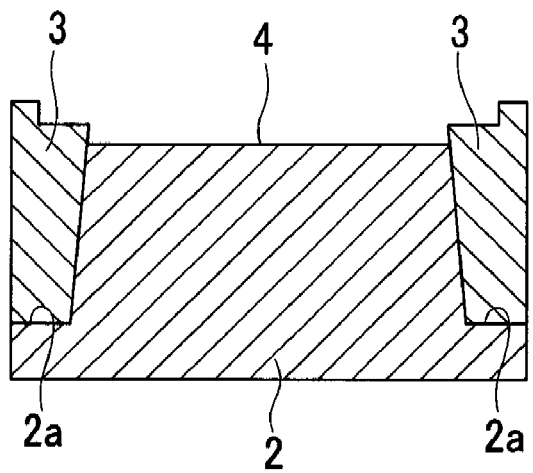
FIGS. 16A to 16C are also sectional views showing one of the manufacturing processes.
Figure 16B:
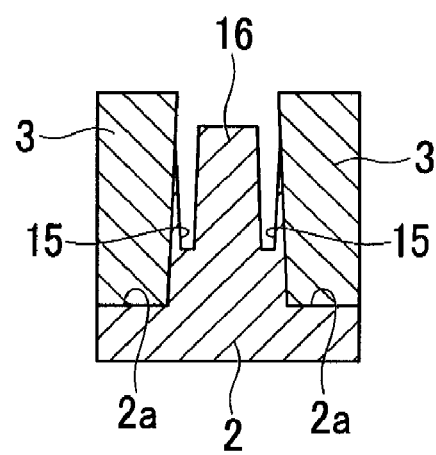
Figure 16C:
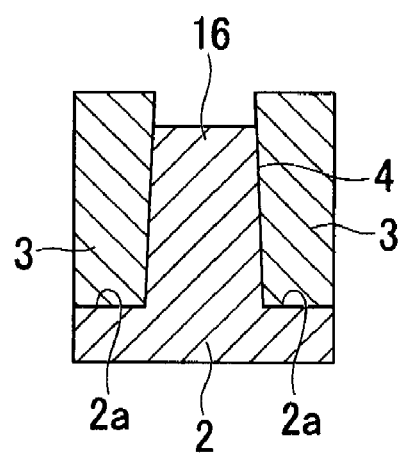

Next, as shown in FIGS. 14A to 14C, the silicon oxide film 25 is removed by using a hydrofluoric acid. In addition, as shown in FIGS. 15A to 15C, the silicon nitride film 24 is removed by using a hot phosphoric acid. In addition, as shown in FIGS. 16A to 16C, the silicon oxide film 21 is removed by using a hydrofluoric acid.

Figure 17A:
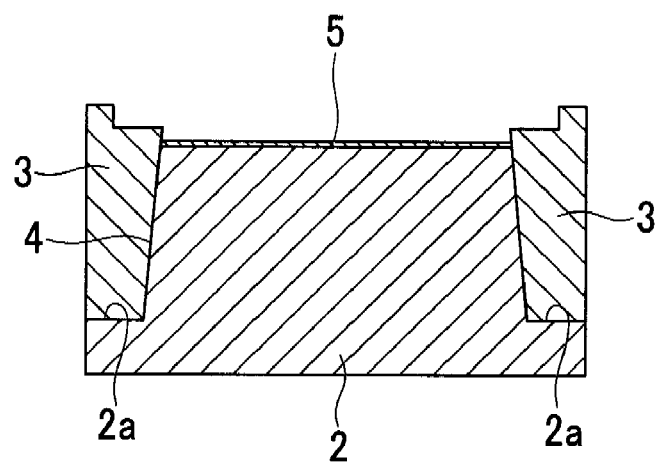
FIGS. 17A to 17C are also sectional views showing one of the manufacturing processes.
Figure 17B:
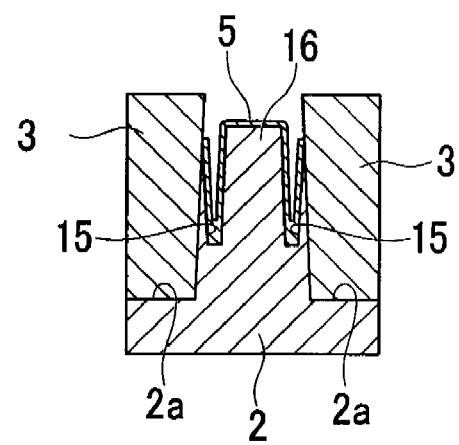
Figure 17C:
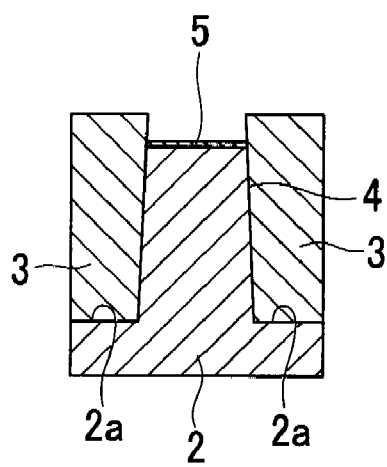

Next, as shown in FIGS. 17A to 17C, the surface of each active area 4 is oxidized by means of thermal oxidation, so as to form a gate insulating film 5 made of a silicon oxide film. The gate insulating film 5 is not limited to a silicon oxide film formed by thermal oxidation, and may be a high-temperature silicon oxide film (i.e., HTO film) formed by means of CVD, or a high-dielectric-constant film. In the concrete example, the gate insulating film 5 having a thickness of 7 nm was formed by thermal oxidation.

As shown in FIG. 2, in the relevant manufacturing method, the gate insulating film 5 has a form in which the thickness of the part which contacts the bottom surface 15a of each trench 15 is larger than that of the part which contacts the upper surface 16b of the fin 16 (i.e., $S_T < S_B$). Therefore, in the relevant manufacturing method, each of the trenches 15 formed on both sides of each active area 4 has a form in which the width gradually decreases toward the bottom surface 15a thereof, so that each side face 16a of the fin 16 is inclined with respect to the bottom surface 15a.

More specifically, when implementing the present invention, it is preferable that (i) the width $W_B$ of the bottom surface 15a of each trench 15 is smaller than twice the film thickness $S_T$ of the part (of the gate insulating film 5) which contacts the upper surface 16b of the fin 16 (i.e., $2S_T > W_B$), and (ii) the angle between the bottom surface 15a of the trench 15 and the corresponding side face 16a of the fin 16 is greater than or equal to 85°, and smaller than 90° (i.e., $85° \leq \theta < 90°$).

Accordingly, in the relevant manufacturing method, when forming the gate insulating film 5, the thickness $S_B$ of the part which contacts the bottom surface 15a of each trench 15 can be larger than the thickness $S_T$ of the part which contacts the upper surface 16b of the fin 16, in a self-alignable manner.

Figure 18A:
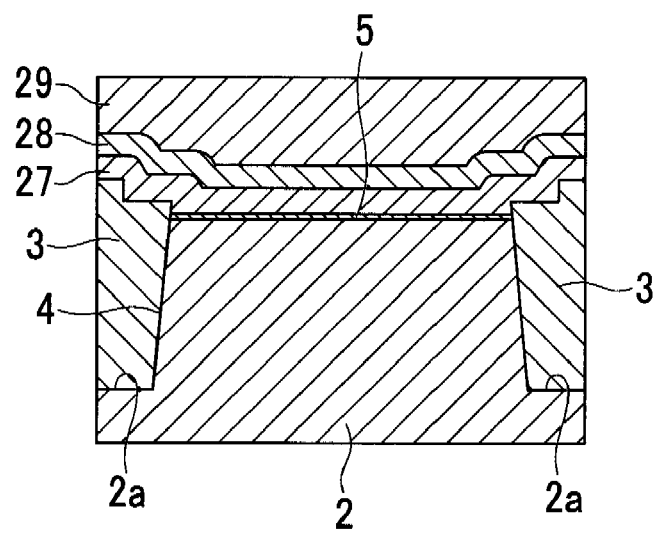
FIGS. 18A to 18C are also sectional views showing one of the manufacturing processes.
Figure 18B:
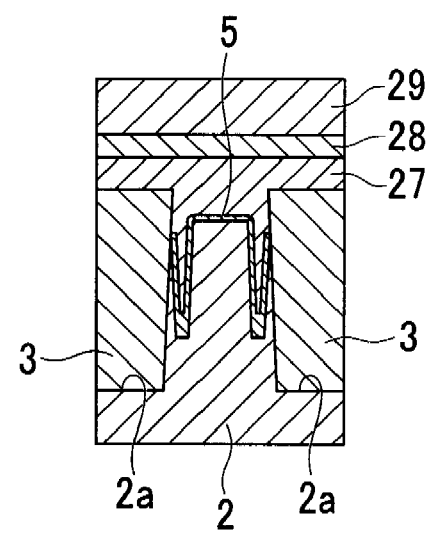
Figure 18C:
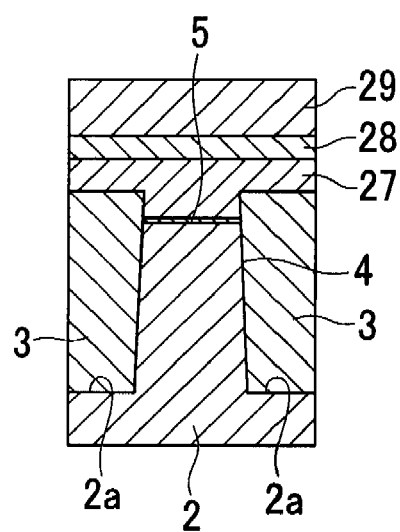

Next, as shown in FIGS. 18A to 18C, a polysilicon film 27 (functioning as the gate electrodes 6), a multilayer film 28 (functioning as the word wiring lines 12) of tungsten (W) and tungsten nitride (WN), and a silicon nitride film 29 (functioning as the insulating-film hard masks 13) are sequentially stacked on the entire surface of the semiconductor substrate 2.

Figure 19A:
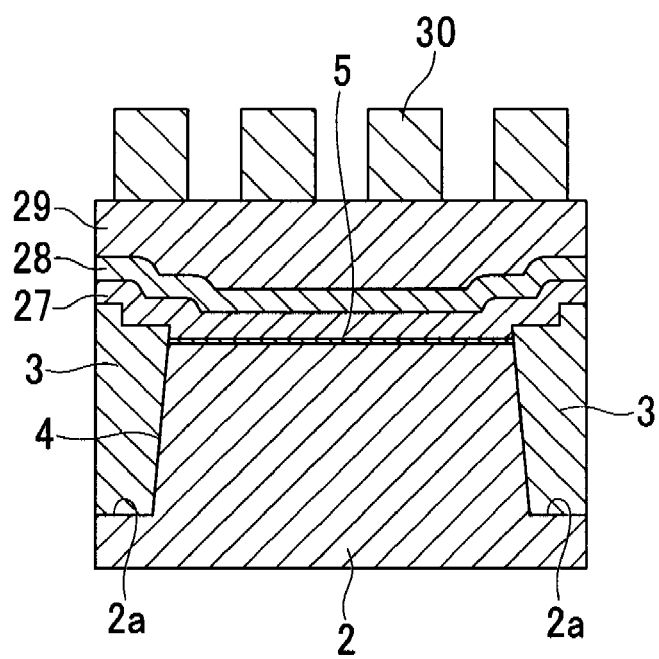
FIGS. 19A to 19C are also sectional views showing one of the manufacturing processes.
Figure 19B:
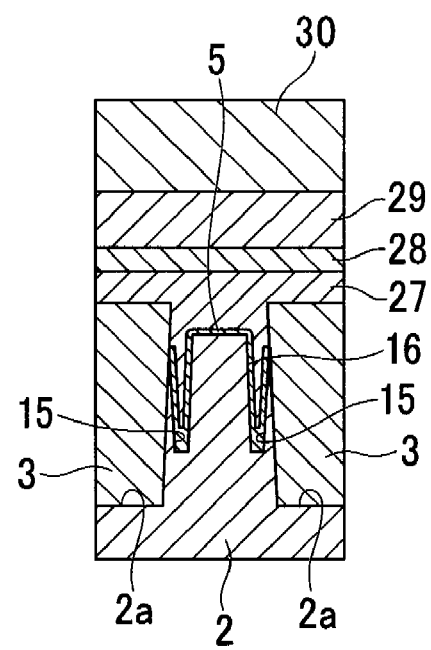
Figure 19C:
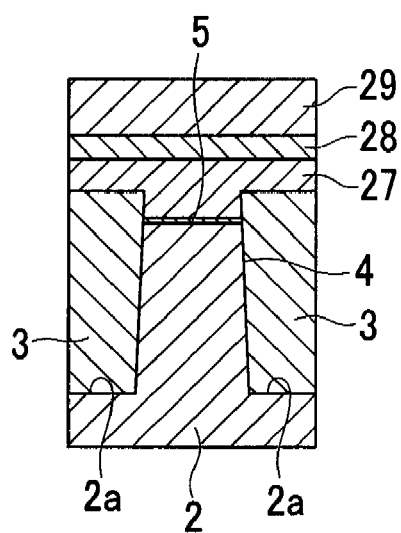

Next, as shown in FIGS. 19A to 19C, a resist is deposited on the silicon nitride film 29, and is then patterned by means of lithography, so as to form a resist pattern 30 corresponding to the relevant areas on the gate electrodes 6. The polysilicon film 27, the W-WN multilayer film 28, and the silicon nitride film 29 are subjected to patterning by means of dry etching which uses the resist pattern 30 as a mask, and then the resist pattern 30 is removed.

Figure 20A:
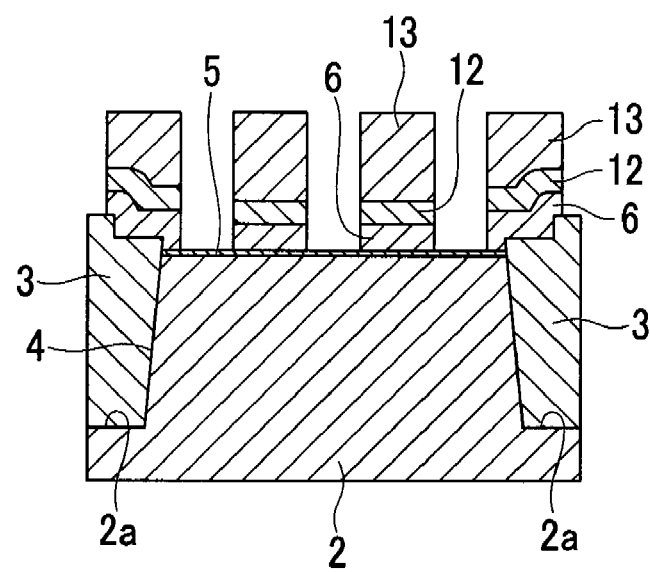
FIGS. 20A to 20C are also sectional views showing one of the manufacturing processes.
Figure 20B:
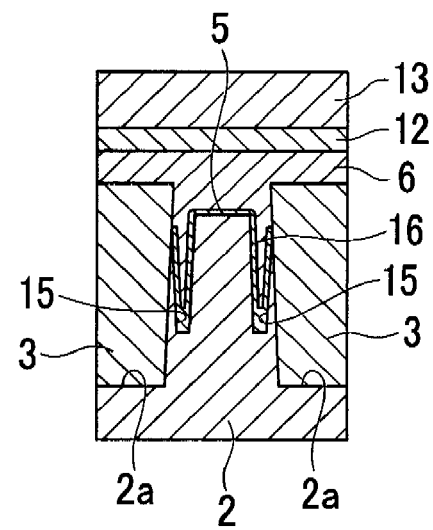
Figure 20C:
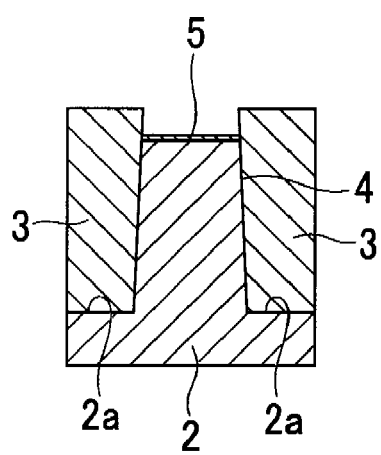

Accordingly, as shown in FIGS. 20A to 20C, the gate electrodes 6, the word wiring lines 12, and the insulating-film hard masks 13 are formed. In addition, inside each trench 15, part of the relevant gate electrode 6 is embedded via the gate insulating film 5, and the gate electrode 6 extends across the relevant fin 16, which rises between the trenches 15 on both sides thereof.

Figure 21A:
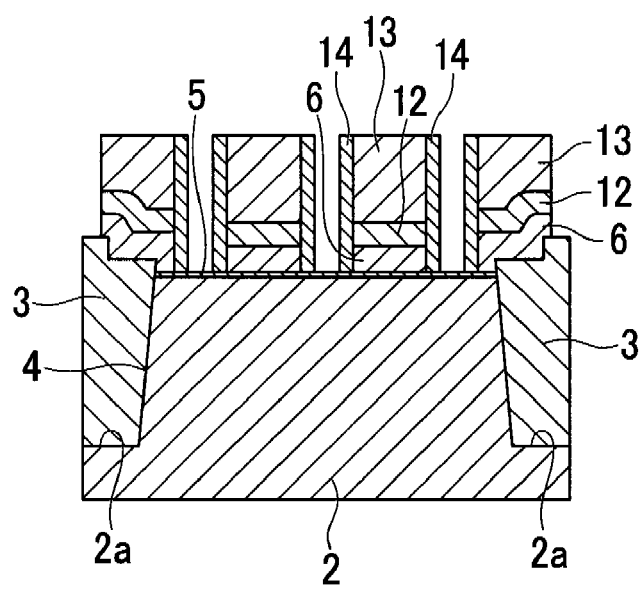
FIGS. 21A to 21C are also sectional views showing one of the manufacturing processes.
Figure 21B:
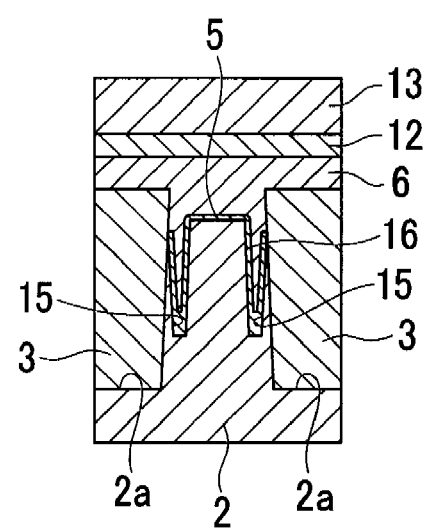
Figure 21C:
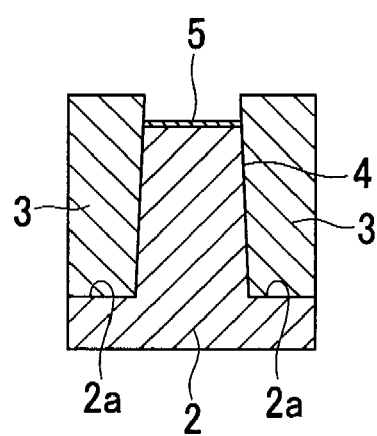

Next, as shown in FIGS. 21A to 21C, the above-described side walls 14 are formed by forming a silicon nitride film, and then performing back-etching by means of anisotropic dry etching. In the concrete example, the formed silicon nitride film had a thickness of approximately 17 nm.

Figure 22A:
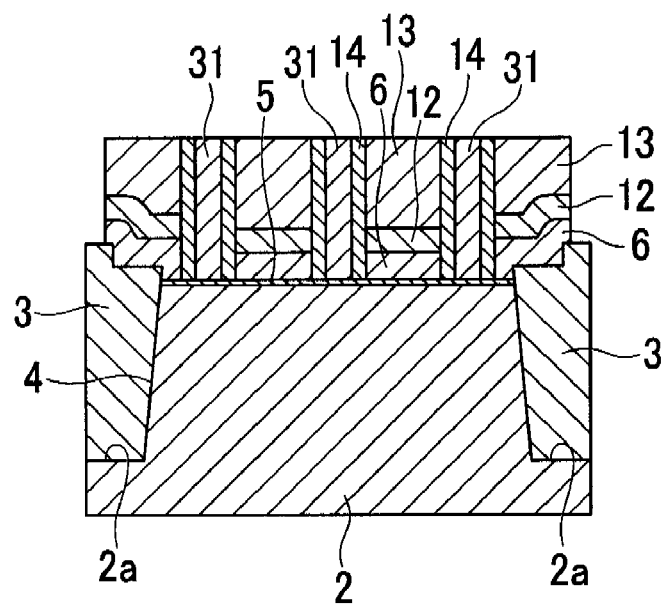
FIGS. 22A to 22C are also sectional views showing one of the manufacturing processes.
Figure 22B:
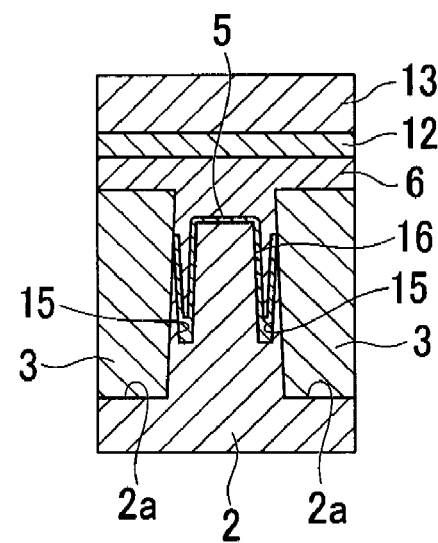
Figure 22C:
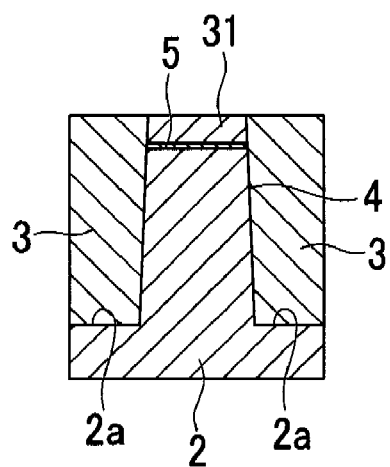

Next, as shown in FIGS. 22A to 22C, a silicon oxide film 31 is formed on the entire surface of the semiconductor substrate 2, and is polished by means of CMP so as to produce a planar surface thereof. In the concrete example, the silicon oxide film 31 having a thickness of approximately 500 nm was formed, and surface planalization was performed by polishing the silicon oxide film 31 by approximately 200 nm by CMP.

Figure 23A:
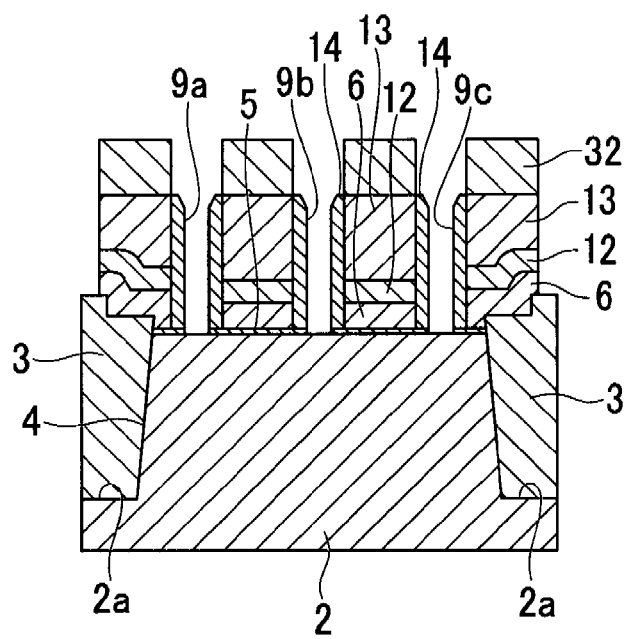
FIGS. 23A to 23C are also sectional views showing one of the manufacturing processes.
Figure 23B:
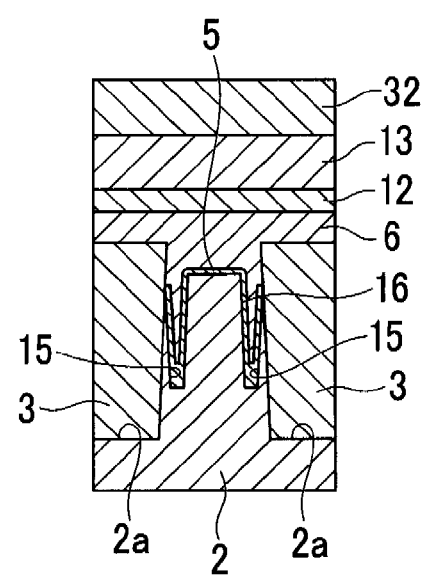
Figure 23C:
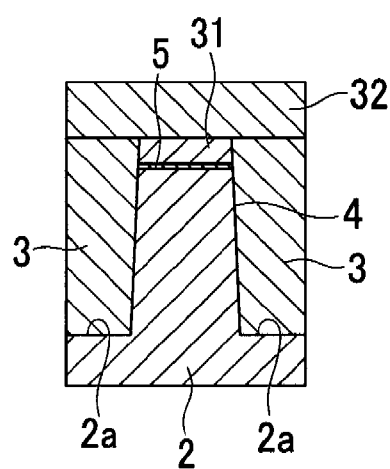

Next, as shown in FIGS. 23A to 23C, a resist is deposited on the semiconductor substrate 2, and is then patterned by means of lithography, so as to form a resist pattern 32 having openings whose positions correspond to the drain area 7 and the source areas 8a and 8b of each active area 4. The silicon oxide film 31 is then subjected to patterning by means of dry etching which uses the resist pattern 32 as a mask, thereby forming the above-described contact holes 9a, 9b, and 9c.

Next, impurities are doped into the exposed areas of the active area 4, which are exposed through the contact holes 9a, 9b, and 9c, thereby respectively forming the source area 8a, the drain area 7, and the source area 8b. In the concrete example, ion implantation of P (as the impurities) was performed, where the amount of the implanted ions was $6 \times 10^{12}$ cm$^{-2}$. Instead, ion implantation of P and As may be performed. In this case, it is preferable that the amount of the implanted P ions is $6 \times 10^{12}$ cm$^{-2}$, and the amount of the implanted As ions is $1 \times 10^{13}$ cm$^{-2}$.

Figure 24A:
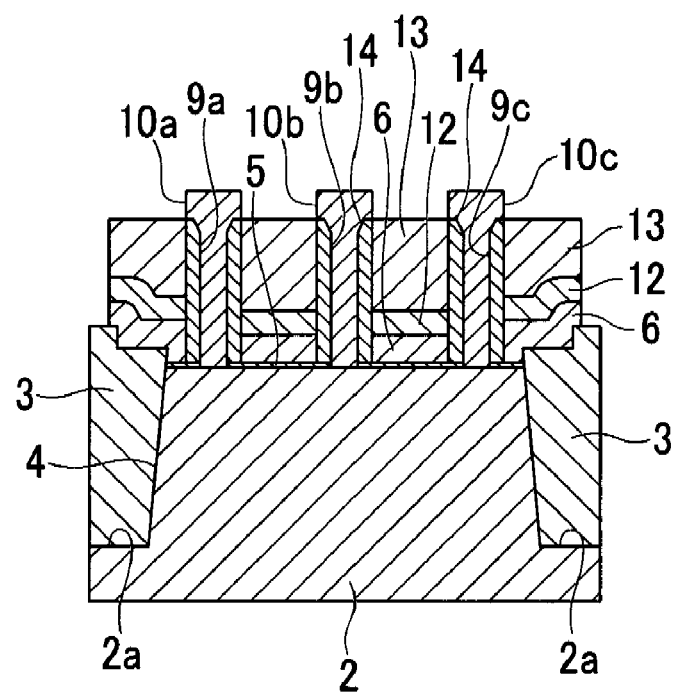
FIGS. 24A to 24C are also sectional views showing one of the manufacturing processes.
Figure 24B:
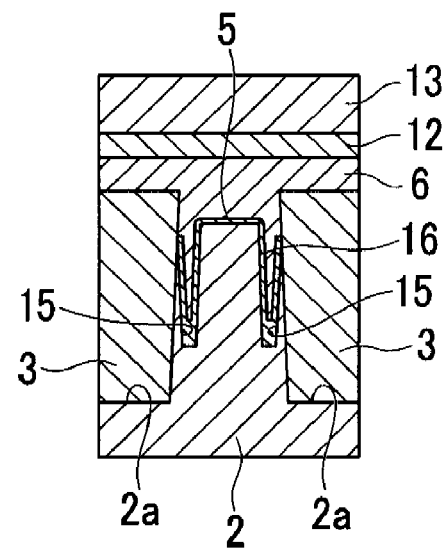
Figure 24C:
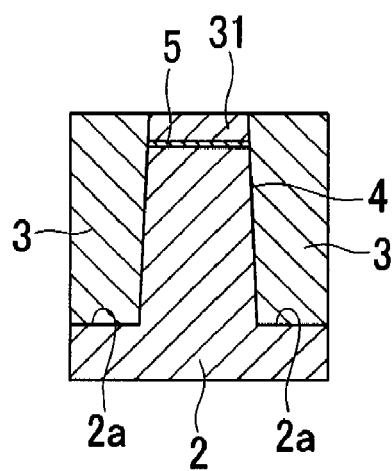

Next, as shown in FIGS. 24A to 24C, a polysilicon film, which will function as the contact plugs 10a, 10b, and 10c, is formed, and then the resist pattern 32 is removed. Accordingly, the contact plugs 10a, 10b, and 10c, which are respectively embedded in the contact holes 9a, 9b, and 9c, are formed. In the concrete example, a polysilicon film, to which P was doped, was formed, where the thickness of the film was 300 nm, and the impurity concentration of P was $4 \times 10^{20}$ cm$^{-3}$.

In accordance with the above-described processes, the fin-FET 1 can be manufactured.

The following processes are not shown, but through ordinary manufacturing processes applied to DRAMs, the relevant DRAM can be manufactured, in which the fin-FET 1 is used as a transistor for selecting one of the memory cells arranged in the cell array area, and a 2-bit memory cell is provided in each active area.

As described above, in the relevant manufacturing method, the trenches 15 are formed on both sides of each active area 4, and part of the gate electrode 6 is embedded in each trench 15 via the gate insulating film 5, thereby forming a fin-channel structure in which the gate electrode 6 extends across the fin 16 which rises between the trenches 15 on both sides thereof. In the gate insulating film 5 of this structure, the thickness $S_B$ of the part which contacts the bottom surface 15a of each trench 15 is larger than the thickness $S_T$ of the part which contacts the upper surface 16b of the fin 16 (i.e., $S_T<S_B$). Therefore, it is unnecessary to perform an ion implantation process for increasing the impurity concentration of the substrate so as to increase the threshold voltage (Vth) of the relevant sub channel. Accordingly, it is possible to manufacture the fin-FET 1 by which an ever higher speed of a high-speed device can be targeted without increasing the manufacturing cost.

While preferred embodiments of the present invention have been described and illustrated above, it should be understood that these are exemplary embodiments of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

For example, the present invention is not limited to the fin-FET 1, and can be widely applied to (i) a semiconductor device in which trenches are provided on both sides of each active area, and part of the gate electrode is embedded in each trench, so that the gate electrode extends across a fin which is formed so as to rise between the trenches, and (ii) a relevant transistor.

What is claimed is:

1. A semiconductor device comprising:
   an active area defined by an element-separation insulating film embedded in a substrate;
   a gate insulating film formed on the active area;
   a gate electrode formed in a manner such that the gate-electrode extends across the active area via the gate insulating film;
   a source area and a drain area formed in the active area in a manner such that the source and drain areas interpose the gate electrode; and
   a fin-channel structure defined by trenches formed on the active area and provided under the gate electrode, wherein:
   in the gate insulating film, a film thickness of a part which contacts a bottom surface of each trench is larger than that of a part which contacts an upper surface of the fin-channel structure.

2. The semiconductor device in accordance with claim 1, wherein:
   each of the trenches has a form whose width gradually decreases toward the bottom surface of the trench, so that each side face of the fin-channel structure is inclined toward the bottom surface of the corresponding trench.

3. The semiconductor device in accordance with claim 2, wherein:
   the width of the bottom surface of each trench is smaller than twice the film thickness of the part of the gate insulating film, which contacts the upper surface of the fin-channel structure.

4. The semiconductor device in accordance with claim 3, wherein:
   the angle between the bottom surface of the trench and the corresponding side face of the fin-channel structure is greater than or equal to 85°, and smaller than 90°.

5. The semiconductor device in accordance with claim 2, wherein:
   the angle between the bottom surface of the trench and the corresponding side face of the fin-channel structure is greater than or equal to 85°, and smaller than 90°.

6. A transistor comprising:
   source and drain areas;
   a first region sandwiched between the source and drain areas, the first region producing a first current path between the source and drain areas in response to a first voltage that is larger in absolute value than a first threshold voltage;
   a second region sandwiched between the source and drain areas in parallel to the first region, the second region producing a second current path between the source and drain areas in response to a second voltage that is larger in absolute value than a second threshold voltage, the second voltage being larger in absolute value than the first voltage;
   a trench provided between the source and drain areas in parallel to the first and second regions, the first region having a side surface defining a first part of the trench and the second region having a side surface defining a second part of the trench; and an insulating film having a first portion covering the first part of the trench and a second portion covering the second part of the trench, the first portion being smaller in thickness than the second portion.

7. The transistor in accordance with claim 6, further comprising:

a gate electrode filling the trench in contact with the first and second portions of the insulating film.

8. The transistor in accordance with claim 7, wherein the gate electrode is in contact at a bottom portion thereof with the second portion of the insulating film.

* * * * *